United States Patent
Moolenbeek et al.

[11] 3,946,373
[45] Mar. 23, 1976

[54] CONTROL CIRCUIT FOR A ROTATING MAGNETIC FIELD OF A BUBBLE MEMORY

[75] Inventors: Rob Moolenbeek, Burlington; Bent Norlund, Sudbury, both of Mass.

[73] Assignee: GTE Laboratories Incorporated, Waltham, Mass.

[22] Filed: Sept. 9, 1974

[21] Appl. No.: 504,203

[52] U.S. Cl. .................................... 340/174 TF
[51] Int. Cl.² .................................... G11C 11/14
[58] Field of Search ....... 340/174 TF; 331/166, 173, 331/177 R, 128

[56] References Cited
UNITED STATES PATENTS

| | | | |
|---|---|---|---|
| 3,720,883 | 3/1973 | Hess, Jr. et al. | 340/174 TF |
| 3,866,145 | 2/1975 | Hess, Jr. et al. | 340/174 TF |

*Primary Examiner*—James W. Moffitt
*Attorney, Agent, or Firm*—Irving M. Kriegsman; Leslie J. Hart

[57] ABSTRACT

A control circuit for the current in a pair of coils, which are utilized for generating a rotating magnetic field, supplies a sinusoidal current to each coil during the normal, operate mode and a maximum DC current to the coils whenever the operate mode is initiated or stopped. Each coil is a common element in the sinusoidal and DC current supplying circuits. A transistor switch, which is open during the operate mode, is connected in series with the coil in the circuit for the DC current and is connected in parallel with the coil in the circuit for the sinusoidal current through the coil. Since the switch is open and is connected in series in the circuit for the DC current no DC current flows through the coil during the operate mode. Whenever the operate mode is initiated or stopped, the transistor switch is closed so that both the sinusoidal and DC currents flow through the switch. However, only the DC current flows through the coil, since the switch forms a shunt path around the coil for the sinusoidal current. This arrangement inhibits the sinusoidal current from simultaneously flowing through the coil and the switch, so that the switch does not distort the sinusoidal current which flows through the coil. The DC magnetic field at the beginning and end of the operate mode insures that the bubbles in the propagation path of the cylindrical domain memory do not move in an unpredictable manner when the rotating field starts or stops.

9 Claims, 5 Drawing Figures

CONTROL CIRCUIT FOR A ROTATING MAGNETIC FIELD OF A BUBBLE MEMORY

BACKGROUND OF THE INVENTION

The present invention relates to field accessed, cylindrical domain bubble memories and, more specifically, to a control circuit for the rotating magnetic field.

Magnetic bubble domains constitute a type of domain structure characteristic of thin films of magnetic materials which possess a uniaxial magnetic arisotrophy with the easy direction of magnetization perpendicular to the plane of the film. A domain which is enclosed by a single continuous domain wall shrinks to the shape of a cylindrical magnetic bubble when a magnetic field bias of a particular magnetic is applied perpendicular to the plane of the film. The magnetic domain bubbles are mobile and move toward a region of lower bias field in a gradient. Various methods have been devised for producing localized and variable gradients in the bias field to give coherent bubble motion or propagation. The most generally useful method of that in which an overlay pattern of thin film, soft magnetic elements is placed close to the bubble film and excited with a rotating magnetic field in the plane of the film. For a given orientation of the rotating field, the resulting magnetic polarization of these elements produces fringing fields which act to reduce the bias field in some regions and to increase it in others; the bubbles always move to the regions of low bias field. As the in-plane field rotates, these fringing fields vary with the varying polarization of the permalloy element and can be used to produce coherent motion of the bubble.

The circuit for creating the rotating magnetic field commonly includes a pair of coils which are positioned perpendicular to each other and an AC current source for supplying current to the coils. A separate current is supplied to each coil, and the two AC currents are 90° out of phase. The total effect of the individual magnetic fields from the current in each coil is a rotating magnetic field vector which extends throughout a region into which the bubble memory is disposed.

One of the important requirements of this system is the need for the rotating magnetic field to be coherent so that the data storage remains in a non-volatile state. In other words, any particular bubble, which represents a bit of digital data, must have a predictable location within the propagation track at all times. Thus, the currents which produce the rotating field during the operate mode must have the proper phase relationship, frequency and amplitude. The location of the bubbles must also be predictable during the start and end of the operate mode. If there is no current in the coils when the AC current is initiated or if the current goes to zero at the end of the operate mode, a time delay is introduced to the inductive nature of the coils. This delay could cause the loss of coherent operation of the memory during the beginning and at the end of the operate mode.

Prior art is known which deals with minimizing the tendency of transient conditions from causing the loss of non-volatile data storage in bubble memories. The U.S. Pat. No. 3,763,478 describes various control circuits for the currents which create the rotating magnetic field. In one circuit, a DC current is supplied to the coils at the beginning and at the end of the application of AC current to create a static field vector condition. The DC current is less than the peak AC value. The control circuit described in this patent includes a pair of switches in series with the coil. It has been found that switches produce distortion in the AC current. This distortion may interfere with the signals generated by the bubble detector circuits. To the knowledge of the present inventors, no control circuit is known which reduces the time for energizing the coils to a minimum at the beginning and end of the rotating magnetic field in a economical distortion free manner.

SUMMARY OF THE INVENTION

According to the present invention, an improved circuit for creating a rotating magnetic field and a static magnetic field at the beginning and the end of the rotating magnetic field operation is provided wherein the AC current through the coil does not simultaneously flow through the switch which controls AC or DC current flow through the coil. The improved circuit includes a switch which is connected in parallel with the coil for shunting the AC current away from the coil when the switch is closed, a DC current source connected in series with the network comprising the coil and the switch for providing a DC current through the coil when the switch is closed and a device for closing the switch to create a static magnetic field. By this provision of a shunt path for the AC current, the rotating magnetic field, which is created by the AC current in a pair of coils, is not distorted. When an AC current passes through a resonant circuit in which a switch is located, the switch may induce distortions in the current. The resulting distorted magnetic field may interfere with the signals generated at a bubble detector circuit, such as the magneto-resistive type. The operation of the magneto-resistive detector is based on detecting variations of the AC magnetic field; and, therefore, a distortion in the AC magnetic field could cause improper detector operations.

These are several additional features of the preferred embodiments of the present invention. The transition to and from AC current to the coil occurs when the AC current is at a peak value, and the DC current level is equal to the peak value of AC current. Thus, maximum energy is stored in the coil which maintains at a minimum the time required to change from a true AC to a DC current in the inductive coil and vice versa. This feature is accomplished by sychronizing the time of switching to the AC current waveform and by providing a diode in the path of the switch. The diode does not become forward biased until the AC current is at its peak value. The switch is preferably a transistor whose collector and emitter terminals are connected to the AC current shunt path. A transistor network, responsive to a control signal, forward biases the base-emitter junction of the transistor switch when the switch is to close. All of the transistors, including the transistor comprising the switch and those in the control network, are in a non-conductive state during the time in which AC current flows in the coils. Thus, less power is consumed in an arrangement in which a single transistor switch is normally open than is consumed in an arrangement in which one or more switches is normally closed, as is the case in the prior art of which the inventors are aware. Additionally, the present invention requires only one switch which is an economic advantage over circuits in which a plurality of switches are necessary. Furthermore, the transistor which forms the switch need not be designed for minimum distortion since any distortion which it may induce into the AC current has no effect on the AC magnetic field. In an additional feature, the overall impedance of the AC circuit when the switch is closed is substantially greater than when the switch is open, thereby decreasing the value of the AC shunt current from that which flows through the coil. By forming a low resistance shunt path around the coil, the AC current source no longer supplies current to a resonant circuit.

DESCRIPTION OF THE PREFERRED EMBODIMENTS

Figure 1:
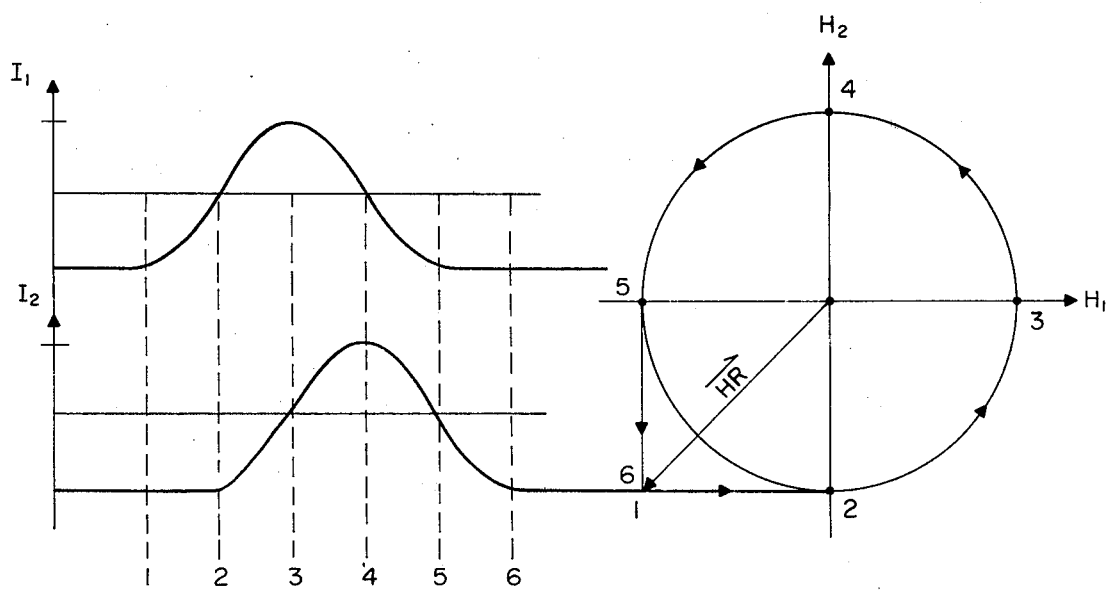
FIG. 1 illustrates the waveforms of current and the rotation of the field vector in accordance with the control circuit of the present invention.
Figure 2:
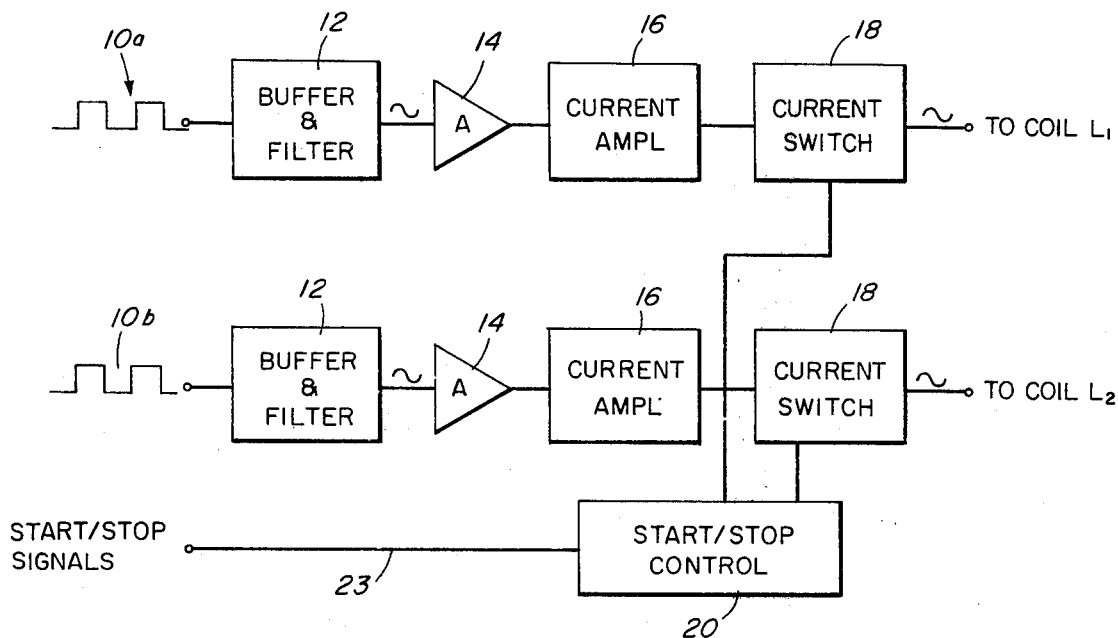
FIG. 2 is a block diagram of a rotating field drive circuit according to the present invention.
Figure 1A:
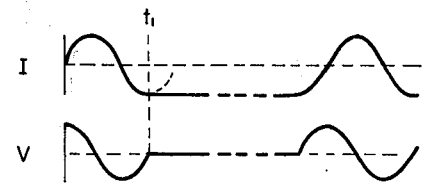
FIG. 1a illustrates waveforms which indicate the effect of the diode in the transition between AC and DC current flow.

Referring now to FIG. 1, the rotating magnetic field generates the in-plane rotating field which, together with a suitably designed permalloy track, causes domain propagation (bubble movement) of a field accessed, cylindrical magnetic domain memory. The present invention provides controlled switching of the coil drive currents for coherent start/stop operation and nondestructive shutdown of the bubble memory system. To maintain non-volatile data storage in a bubble memory while turning the rotating field on and off, a coherent fast start-up procedure is necessary. The invention provides this start-up within one-eighth of a cycle of a field rotation by storing the energy in both coils in the form of two DC currents. This energy can be provided by either a battery or a stored charge on a large capacitor since this energy need only be provided during start-up and shut-down. Two coils wound at right angles to each other provide the rotating field when driven by currents $I_1$ and $I_2$, as shown in FIG. 1. For initial start-up, two DC currents equal to $I_{max}$ are simultaneously applied to coils $I_1$ and $I_2$ (not shown) in such a direction as to produce fields $H_1$ and $H_2$. These two fields which are in quadrature produce a resultant field $H_R$ (with its vector tip) at point 1. Switch 1 is turned to the run position first, followed at 90° (one quarter period later) by Switch 2. This causes the tip of $H_R$ to follow the path indicated, proceeding consecutively past points 1, 2, 3, 4 and 5. Rotation may then continue or the field may be switched off as indicated in FIG. 1 by first operating Switch 1 followed 90° later by Switch 2. If this is done, a static field $H_R$ is maintained. To return to zero field (e.g., for power shutdown) $H_1$ and $H_2$ must be made to return to zero simultaneously. This is accomplished by bringing $I_1$ and $I_2$ to zero together. FIG. 2 illustrates a block diagram of the circuitry for controlling the generation of a rotating magnetic field for the propagation of cylindrical magnetic bubbles. The rotating field is created by positioning a pair of coils at an angle of 90° with respect to each other and passing through the coils sinusoidal currents which are out of phase by 90 electrical degrees. The two coils are represented in FIG. 2 as L1 and L2. The two circuits for providing the the two currents are quite similar, and for this reason the operation of only one circuit shall be described. Referring now to the circuitry for producing the current for the coil L1, a clock circuit (not shown) creates a pair of digital clock signals 10a and 10b, which are 90° out of phase with each other. Each signal is a square wave having a frequency which corresponds to the desired excitation frequency of the current in the coils. Typically, the frequency is 100KHz. The signal 10a is sent to a buffer and filter 12. Here, the harmonic frequencies of the fundamental frequency are filtered from the signal 10a thereby producing a sinusoidal waveform of the same frequency as the square wave signal 10a. The signal output of the buffer and filter 12 is amplified by an amplifier 14 and a current amplifier 16. The output of the amplifier 16 is directed to a current switch 18 and to the coil assembly L1. A start/stop control 20 also provides an input to the current switch 18. The control 20 receives a signal 23 which controls the start and stop of the operate mode which is defined herein as the period in which the rotating magnetic field is generated. The current to the coil is from the control 20 at the beginning and end of the operate mode.

Figure 3:
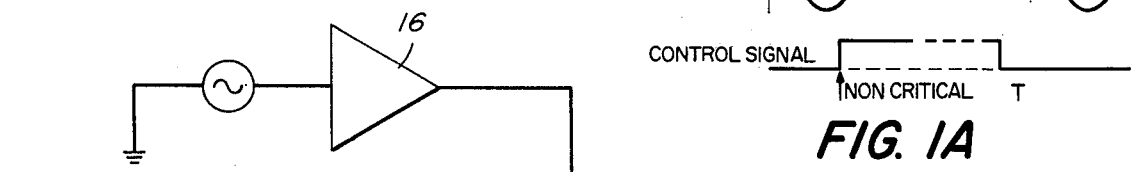
FIG. 3 is a schematic diagram of the start/stop control circuit according to the present invention.
Figure 3:
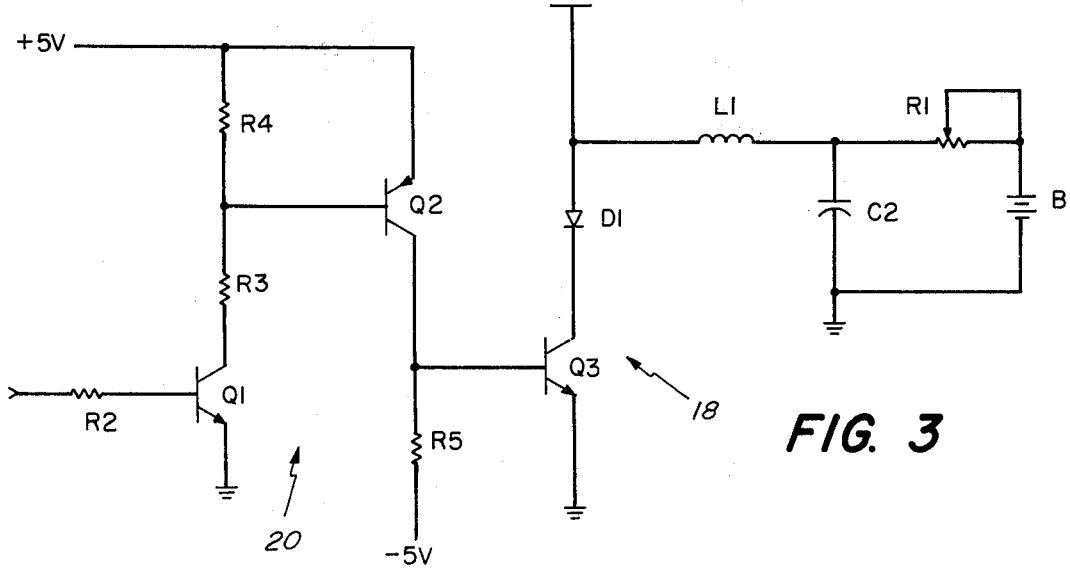

Referring now to FIG. 3, the coil L1 is illustrated and shown as it is connected to the current switch 18, the start/stop control 20 and the current amplifier 16 in FIG. 1. During the operate mode in which the coil L1 is driven by a sinusoidal current, the sinusoidal current flows from the current amplifier 16 to ground via a capacitor C1, the coil L1 and the capacitor C2. At the beginning or the end of the operate mode, the DC current flows from a voltage source B to ground via a resistor R1, the coil L1, a diode D1, and a transistor Q3. While the DC voltage source is shown as a battery, the source may alternatively be a capacitor which need only be charged at the beginning and end of the operate mode. The transistor Q3, which is the current switch 18 of FIG. 1, is driven into conduction at the beginning and end of the operate mode and is cutoff during operate mode.

The switching of the transistor Q3 is controlled by the network comprising transistors Q1 and Q2. The input control signal is applied to a resistor R2 which is connected to the base of the NPN transistor Q1. The bias voltage for the collector of Q1 is established through the network including the +5 volts DC and the resistors R3 and R4. The bias voltage of +5 volts DC is also connected to the emitter of the PNP transistor Q2. The emitter of the transistor Q1 is grounded. The base of the transistor Q2 is connected to the junction of the resistors R3 and R4. The bias for the collector of the transistor Q2 and for the base of the transistor Q3 is established by the network comprising the −5 volts DC and a resistor R5. The emitter of the NPN transistor Q3 is grounded.

In the circuit, shown in FIG. 2, the values or identifications of the various components are as follows:

| | |
|---|---|
| L1 — .1 m henry | R4 — 2k ohm |
| C1 — .05 μ farad | R5 — 100 ohm |
| C2 — 100 μ farad | Q1 — 2N2219 |
| R1 — 1 ohm | Q2 — 2N5240 |
| R2 — 1 Kohm | D1 — 1N49,44 |
| R3 — 510 ohm | B — 3 volts DC |

The operation control circuit is as follows. During the operate mode, the voltage level of the control signal 23 is not greater than zero volts. Thus, the base to emitter junction of the transistor Q1 is not forward biased. Consequently, the transistor Q1 is cutoff thereby presenting effectively an open circuit across the collector-emitter junction of the transistor Q1. Since the transistor Q1 is not conducting, the voltage at the base of the transistor Q2 is about +5 volts. Thus, the base-emitter junction of the transistor Q2 is not forward biased. This causes an open circuit across the emitter-collector junction of the transistor Q2. The transistor Q3 is also non-conducting because the base-emitter junction is not forward biased. Thus, there is an open circuit across the collector-emitter junction of the transistor Q3. Thus, in this mode neither AC or DC current may flow through the transistor Q3. At the beginning or end of the operate mode, a control signal 23 greater than zero volts is applied to the resistor R2, thereby forward biasing the base-emitter junction of the transistor Q1. This causes a low resistance path to exit across the collector-emitter junction of the transistor Q1. Consequently, the voltage at the base of the transistor Q2 becomes negative with respect to the voltage at the emitter. Thus, the transistor Q2 is turned on, and the low impedance across the collector-emitter junction of the transistor Q2 drives the voltage at the base of the transistor Q3 positive with respect to the voltage at the emitter. As a result, the transistor Q3 is turned on and an effective short circuit exits across the emitter-collector junction of this transistor. The coil L1 is of course a common element in the load circuits for the AC power source, the amplifier 16, and the DC power source, the battery B. The AC load circuit during the operate mode is the series connection of the capacitor C1, the coil L1 and the capacitor C2. The capacitor C2 provides an AC short circuit to ground. Typically, the capacitor C2 may have a capacitance of 100µf for operation at 100KHz. Thus, no AC current flows through the battery B which is connected across the capacitor C2. The value of the capacitor C1 is chosen so that the combination of the capacitor C1 and the coil L1 forms a series resonant circuit. When the transistor switch Q3 turns on, the load circuit for the current amplifier is the path through the capacitor C1, the diode D1, which is forward biased by the voltage from the battery B, and the collector-emitter junction of the transistor Q3. Much less AC current flows when the switch is closed because the AC load impedance of the capacitor C1 above is greater than that of the series connection of the capacitor C1 and the coil L1. During the operate mode, the load circuit of the battery B is an open circuit, and therefore no DC current flows through the coil L1. The open switch, transistor Q3, and the capacitor C2 prevent any DC current from flowing to ground, and the capacitor C1 prevents DC current from flowing into the current amplifier 16. At the beginning and at the end of the operate mode, the switch closes and DC current flows through the circuit comprising the series connection of the resistor R1, the coil L1, the diode D1, which is forward biased, and the collector-emitter junction of the transistor.

The purpose of the diode D1 will now be described with reference to FIG. 1 (a). The first waveform is of the current through the coil L1 including the transition at time $t_1$ between sinusoidal current and DC current. It is important that $t_1$ occur at the instant of maximum negative current. The second waveform is of the voltage at the junction of diode D1, capacitor C1 and coil L1. This voltage which is applied to the coil leads the current (first waveform) through the coil by 90 electrical degrees. The diode D1 becomes forward biased when the voltage applied to the cathode tends to become positive which is at time $t_1$. The third waveform is of the control signal which is shown as going positive somewhere between the time of maximum negative voltage and time $t_1$. In one purpose for the diode the time of the control signal is non-critical in the sense that it may occur at anytime prior to $t_1$ as long as Q3 is fully conducting at time $t_1$. Diode D1 of course prevents current flow through the switch until time $t_1$ because it can not become forward-biased until then. Were it not for the diode, the time of the control signal plus the switching time duration of all three transistors would be critical. The diode, however, makes switching at time $t_1$ depend only upon the diode itself. Lastly, the diode prevents the transistor from going into reverse conduction during normal operation.

Figure 4:
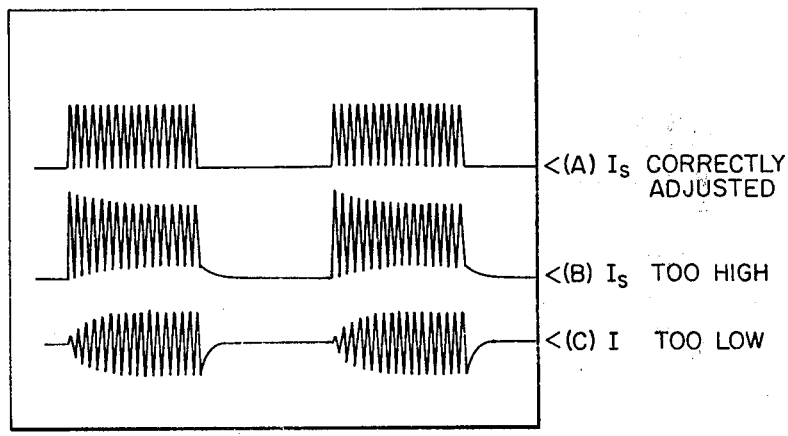
FIG. 4 is a diagram of the waveforms of current for properly and unproperly adjusted values of DC currents.

FIG. 4 illustrates the feature of the present invention by showing waveforms of current in the coils for conditions of proper and unproper values of DC current at the beginning and at the end of the operate mode. The first waveform illustrates that time delay in the transition between proper values of AC and DC current is maintained at a minimum when the DC current level is made equal to the peak AC level and when the switching occurs at the peak AC value. The DC current level is adjusted by the variable resistor R1 in FIG. 3. In the second waveform, the DC current is greater than the peak AC current. In the transition from AC to DC peak AC current, the current rises. In the transition from DC to AC, the AC current exponentially decreases to the proper peak level. The third waveform illustrates the waveform when the DC current is less than the peak AC level. In the transition from AC to DC current, the coil discharges exponentially to the lower current level. Similarly, in the transition from DC to AC current, the AC current must exponentially rise to the peak AC level.

It has been found that placing the switch out of the AC current path for the coil L1 contributes to unexpected advantages. First, a shunt switch minimizes the power drain from the transistor switch and the transistors which control the switch during the operate mode. The operate mode is substantially longer than the duration of the beginning and end of the operate mode if the entire system is shut off when the memory is not in use. Thus, in the operate mode there is no base current for any of the transistors. Moreover, it has been found that a switch in series with the coil in the AC current load, such as in the U.S. Pat. No. 3,763,478, can cause distortions in the AC current to the coils. The switch is somewhat non-linear and such non linearities introduce haromnics into the AC current waveform. These harmonics directly interfere with the signals generated with a magnetic resistive type bubble detector. Such detectors react to harmonics which the detector itself is producing. By placing the switch out of the path of the AC current through the coil, the non-linearity of the transistor switch is relatively unimportant.

While in the preferred embodiment of the present invention the AC operation stops and starts at maximum negative current in both coils, the principle of the present invention is applicable to starting and stopping the AC operation at maximum positive current in both coils or positive current in one coil and negative current in the other coil. To effect positive current operation the circuit of FIG. 3 need only be slightly modified as follows. The connections of the terminals of the diode D1 and the voltage source B are reversed. The −5 volt bias is coupled to the circuit where the +5 volts bias is coupled and vice versa. NPN transistors are replaced by PNP transistors and vice versa. Lastly, the control signal would be inverted.

The embodiment of the present invention is intended to be merely exemplary and those skilled in the art shall be able to make numerous variations in and modifications to the embodiment without departing from the spirit of the present invention. All such modifications and variations are intended to be included within the scope of the present invention as defined in the appended claims.

We claim:

1. In a circuit for propagating domains in a field accessed, cylindrical magnetic domain memory of the type having a pair of coils disposed perpendicular to each other and around a region occupied by the memory, a pair of AC current sources for supplying AC current to the coils, the currents from the sources being in quadrature phase to provide a rotating magnetic field in the plane of the memory and a capacitor associated with each coil to form a resonant circuit at the frequency of the AC current, an improvement comprising:

a. a switch means connected to one terminal of the coil and to a return path for the AC current source to shunt the AC current away from the coil whenever the switch means is closed, the switch remaining open during an operate mode in which the coil is driven by the AC current,
   b. a DC current source connected to the other terminal of the coil for supplying a DC current through the coil whenever the switch means is closed, and
   c. means responsive to a signal input for closing the switch means at the beginning and at the end of the operate mode for shunting the AC current away from the coil and for forming a path for the flow of DC current through the coil to reduce the risk of losing coherent storage of data in the memory, the switch means preventing the AC current from flowing simultaneously through the switch and the coil so that the switch does not introduce distortion in the rotating magnetic field.

2. The circuit according to claim 1 wherein the value of the DC current is equal to the peak value of the AC current and the transition to and from AC current occurs at the peak value of the AC current.

3. The circuit according to claim 2 wherein the DC current for each coil is negative.

4. The circuit according to claim 2 wherein the DC current for each coil is positive.

5. The circuit according to claim 2 wherein the DC current for one coil is positive and the DC current for the other coil is negative.

6. The circuit according to claim 1 wherein the DC current source includes a DC battery connected in series with a resistor whose resistance may be adjusted to provide the DC current at the level of the peak AC current value.

7. The circuit according to claim 1 further including a capacitor connected across the DC current source having a value of capacitance large enough to provide a low impedance path around the DC current source for the AC current.

8. The circuit according to claim 1 further including a diode connected in series with the switch means for ensuring that current does not flow through the switch until the AC current is at a peak value.

9. The circuit according to claim 1 wherein the switch means is a transistor and wherein the means for actuating the switch includes a network of transistors, all of the transistors being in a non conductive state during the operate mode to conserve power.

* * * * *